(12) United States Patent
Kahng et al.

(10) Patent No.: US 7,002,359 B2
(45) Date of Patent: Feb. 21, 2006

(54) APPARATUS AND METHOD FOR MEASURING EMI LEVEL OF ELECTRONIC DEVICE

(75) Inventors: Sung-Tek Kahng, Daejon (KR); Jong-Won Eun, Daejon (KR); Seong-Pal Lee, Daejon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/830,129

(22) Filed: Apr. 21, 2004

(65) Prior Publication Data

US 2005/0134291 A1    Jun. 23, 2005

(30) Foreign Application Priority Data

Dec. 18, 2003    (KR) ...................... 10-2003-0093207

(51) Int. Cl.
   *G01R 27/28*    (2006.01)
(52) U.S. Cl. ..................... 324/627; 324/613; 375/346
(58) Field of Classification Search ................. 342/13, 342/16; 702/57, 60, 182, 183, 189; 324/627, 324/629, 603, 605, 650
   See application file for complete search history.

(56) References Cited

U.S. PATENT DOCUMENTS

2002/0190725 A1 * 12/2002 Craven ...................... 324/627

OTHER PUBLICATIONS

Satoshi Ogasawara, et al., "Measurement and Reduction of EMI Radiated by a PWM Inverter-Fed AC Motor Drive System", IEEE Transactions on Industry Applications, vol. 33, No. 4, Jul./Aug. 1997 (1019-1026).
Leopoldo Angrisani et al., "A Technique for Electromagnetic Interference Measurements on Instruments", , IEEE Transactions on Industry Applications, vol. 33, No. 4, Jul./Aug. 1997 (925-929).

* cited by examiner

*Primary Examiner*—Vincent Q. Nguyen
(74) *Attorney, Agent, or Firm*—Blakely Sokoloff Taylor & Zafman

(57) ABSTRACT

An apparatus and a method for measuring an electric magnetic interference (EMI) level of a radio frequency device is disclosed. The apparatus for measuring a level of electric magnetic interference (EMI) with an electronic device to radiate an electromagnetic wave, the apparatus including: a test device for outputting a signal in response to the electromagnetic wave radiated from the electric device; a calculating unit for calculating a group_delay variation information of the test device by using the signal from the test device; a processor for storing a reference group_delay variation; and an analyzer for analyzing the level of EMI by comparing the reference group_delay variation information and the group_delay variation information.

7 Claims, 4 Drawing Sheets

APPARATUS AND METHOD FOR MEASURING EMI LEVEL OF ELECTRONIC DEVICE

FIELD OF THE INVENTION

The present invention relates to an apparatus and a method for measuring electromagnetic interference (EMI); and more particularity, to an apparatus and a method for measuring an EMI level of an electronic device by statistically analyzing group_delay variation information of the radio frequency device obtained from a vector network analyzer.

DESCRIPTION OF RELATED ARTS

Generally, various electronic components are included in a communication system or an electric home appliance. The electronic components radiate a certain amount of electromagnetic wave to cause an adverse effect by interfering from each other. The above mentioned effect is called an electro magnetic interference (EMI). The EMI degrades an overall performance of the communication system or the electric home appliance. Especially, for designing a high frequency communication system such as a satellite transponder, the EMI problem is one of important factors to consider.

Each of the Ku-band and Ka-band satellite transponders includes a huge number of electric components such as an input multiplexer, an input filter assembly, a diplexer and a test coupler for processing tens of Giga Hertz signals. The overall performances of the Ku-band and the K-band satellite transponders are seriously influenced by the EMI radiated from the electric components.

Therefore, the electric components of the satellite transponder are assembled after being carefully tuned with consideration of characteristics and functions of the satellite transponder. In order to tune the electric components, an EMI level of the electric components needs to be accurately measured.

Conventionally, a method for measuring EMI of electric components includes several processing steps.

At first, an equipment under test (EUT), which is an object of measurement such as an input multiplexer, is connected to a measurement device such as a scalar meter. Secondly, a electromagnetic device such as a horn antenna radiating the electromagnetic wave is located at a fixed place within a predetermined distance and an angle, preferably 90 degrees, from the EUT and the horn antenna is powered on for radiating the electromagnetic wave. The EMI level of the EUT is measured based on frequency spectrum information displayed at the scalar meter.

As mentioned above, the conventional method may not accurately measure the EMI level of EUT since the conventional method measures the EMI level of EUT without considering various factors that may change the influence of EMI radiated from the electromagnetic wave radiating device. The influence of electromagnetic wave may change in response to a direction of the electromagnetic radiating device and to an arrangement of electric components with the EUT in a communication system.

Furthermore, the conventional method may determine the EMI level of EUT with lack of information. The conventional method determines the EMI level of EUT based on frequency spectrum information of the scalar meter. Other information such as variation of amplitude, variation of group_delay information or variation of bandwidth is excluded in determining the EMI level. Therefore, the conventional method may not very informatively the EMI level since the EMI influence may change according to characteristics and functionality of EUT in a communication system.

SUMMARY OF THE INVENTION

It is, therefore, an object of the present invention to provide an apparatus and a method for measuring an electromagnetic interference (EMI) level of an electric or an electronic device by statistically analyzing data of group_delay variation information obtained from a vector network analyzer.

In accordance with an aspect of the present invention, there is provided an apparatus for measuring a level of electromagnetic interference (EMI) with an electronic device to radiate an electromagnetic wave, the apparatus including: a test device for outputting a signal in response to the electromagnetic wave radiated from the electric device; a calculation unit for calculating a group_delay variation information of the test device by using the signal from the device; a processor for storing a reference group_delay variation; and an analyzer for analyzing the level of EMI by comparing the reference group_delay variation information with the group_delay variation information.

In accordance with an aspect of the present invention, there is also provided a method for measuring a level of electromagnetic interference (EMI) with an electronic device to radiate an electromagnetic wave, the method including the steps of: a) loading a reference group_delay information of a device; b) at the electronic device, radiating the electromagnetic wave by moving along a predetermined trace; c) obtaining a group_delay variation information of the device which is varied according to the electromagnetic wave from the electronic device at a predetermined number of detection positions on the predetermined trace; and d) measuring an EMI level of the device by comparing the reference group_delay variation information and the group_delay variation information obtained.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Figure 1:
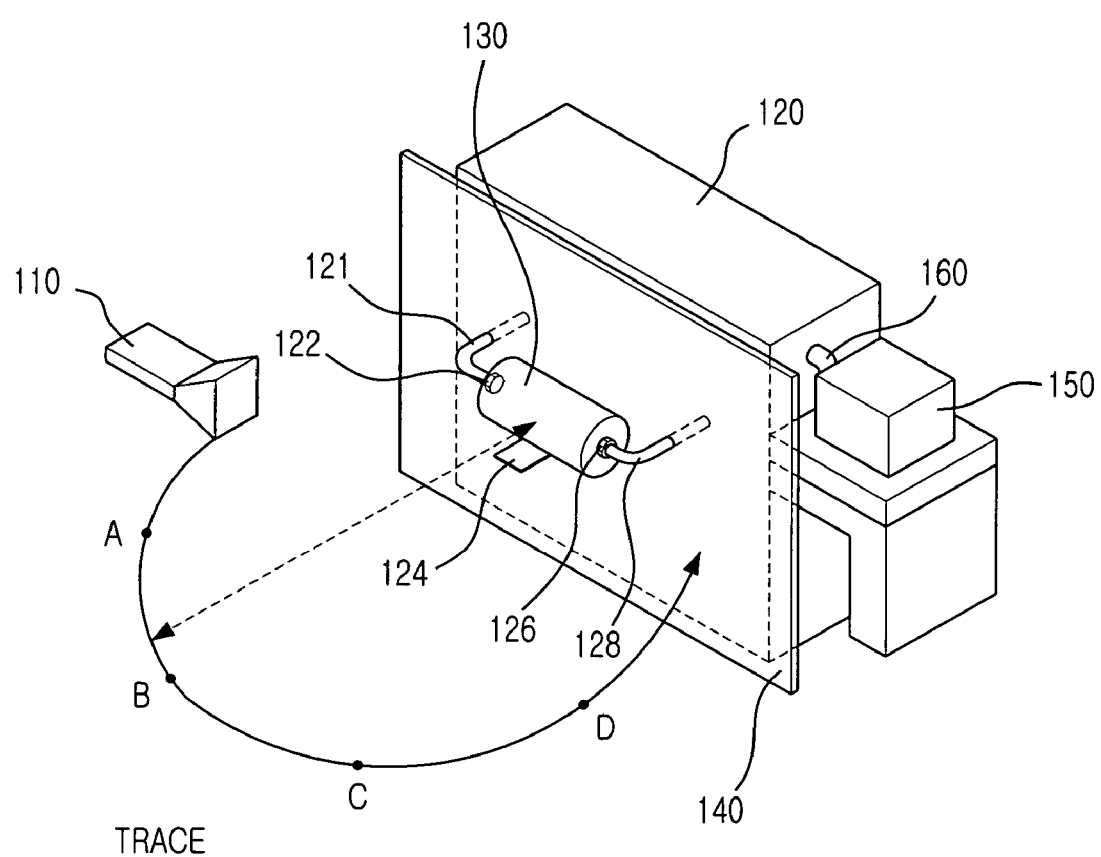
FIG. 1 is a diagram illustrating an apparatus for measuring an EMI level of electric components of a communication system in accordance with a preferred embodiment of the present invention.

FIG. 1 is a diagram illustrating an apparatus for measuring an electromagnetic interference (EMI) level of electric components of a communication system in accordance with a preferred embodiment of the present invention.

As shown in FIG. 1, the apparatus 100 includes a mass electromagnetic radiating device 110, a vector network analyzer 120, an equipment under test (EUT) 130, an electromagnetic wave absorbing plate 140, a computer 150, general purpose interface bus (GPIB) 160 and an EUT mount 124.

The mass electromagnetic radiating device 110 is an electric device radiating mass amount EMI. The mass electromagnetic radiating device 110 moves along a trace in the form of a half-circle around the EUT 130 with separating from the EUT 130 by a predetermined distance and radiating the electromagnetic wave during the movement.

The vector network analyzer 120 is a device that generally measures various characteristics of the EUT 130 by detecting a scattering parameter of a magnitude, a phase, a reflection, a transmission, an impedance and a time delay. In accordance with a preferred embodiment of the present invention, the vector network analyzer 120 presents a scattering parameter of the output signal of the EUT 130 in response to the electromagnetic wave radiated from the mass electromagnetic radiating device 110 and converts a group_delay variation information of the EUT 130 based on the acquired scattering parameter.

In accordance with the preferred embodiment of the present invention, the vector network analyzer 120 includes an input connector 121 and an output connector 128. The input connector 121 is connected to an input end 122 of the EUT 130 and the output connector 128 is connected to an output end 126 of the EUT 130. The vector network analyzer 120 applies an input signal to the EUT 130 through the input connector 121 and receives an output signal which is modified according to a function of the EUT 130 through the output connector 128. The vector network analyzer 120 obtains the variation of the scattering parameter of the output signal due to the electromagnetic wave radiated from the mass electromagnetic radiating device 110. Also, the vector network analyzer 120 is connected to the computer 150 through the general purpose interface bus (GPIB) 160.

The electromagnetic wave absorbing plate 140 absorbs the electromagnetic wave radiated from the mass electromagnetic radiating device 110 in order to protect the vector network analyzer 120 from the EMI. The electromagnetic wave absorbing plate 140 is interleaved between the EUT 130 and the vector network analyzer 120 and covers the vector network analyzer 120.

The EUT 130 is mounted on the EUT mount 124 and is electrically connected to the vector network analyzer 120 by connecting an input end 122 of the EUT 130 to the input connector 121 of the vector network analyzer 120 and the output end 126 of the EUT 130 to the output connector 128 of the vector network analyzer 120, respectively. The EUT 130 receives an input signal from the vector network analyzer 120 through the input end 122 and generates an output signal modified according to a function of the EUT 130. The output signal of the EUT 130 is outputted to the vector network analyzer 120 through the output end 126 of the EUT 130.

In the preferred embodiment of the present invention, the EUT 130 is mounted on the EUT mount 124 for measuring the EMI level. However, the output connector 128 and the input connector 121 can be implemented with a predetermined length of electric wires in order to directly connect the vector network analyzer 120 with the EUT 130 on a circuit board. By directly connecting, an arrangement of electric circuit, which is the very tuning environment of EUT 130, is not disturbed for measuring the EMI level.

The computer 150, connected to the vector network analyzer 120, receives data of measurement and performs various analysis processes for measuring the EMI level of the EUT 130. The computer 150 and the vector network analyzer 120 are connected by the GPIB 160.

Figure 2:
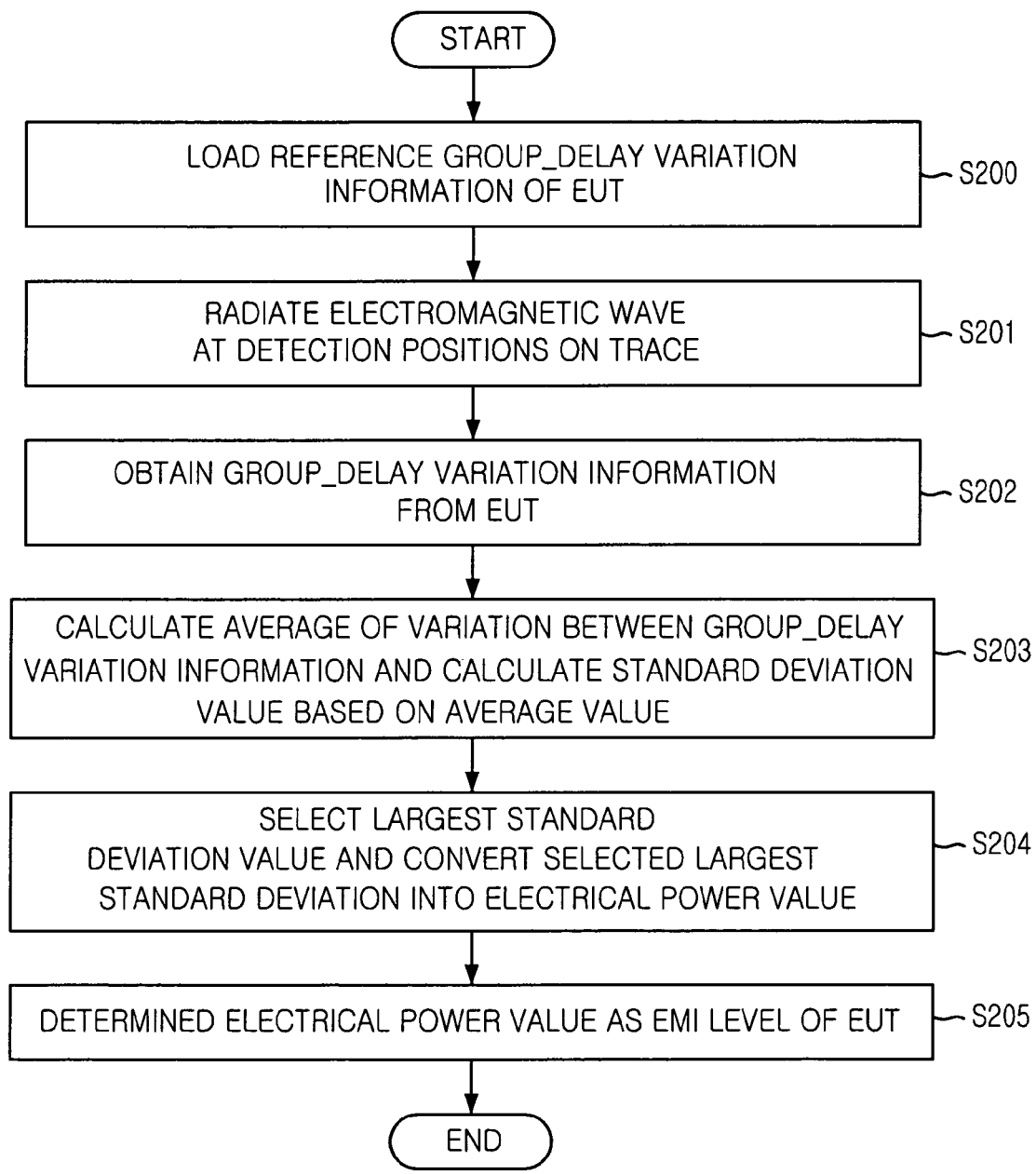
FIG. 2 is a flowchart for explaining a method for measuring an EMI level of electric components in accordance with a preferred embodiment of the present invention.

FIG. 2 is a flowchart for explaining a method for measuring an EMI level of an electronic device for use in a communication system in accordance with a preferred embodiment of the present invention. The computer 150 stores a reference group_delay variation information (e.g., displayed video data).

In the preferred embodiment of the present invention, a horn antenna is used as a mass electromagnetic radiating device and an input multiplexer is used as an EUT.

Figure 3:
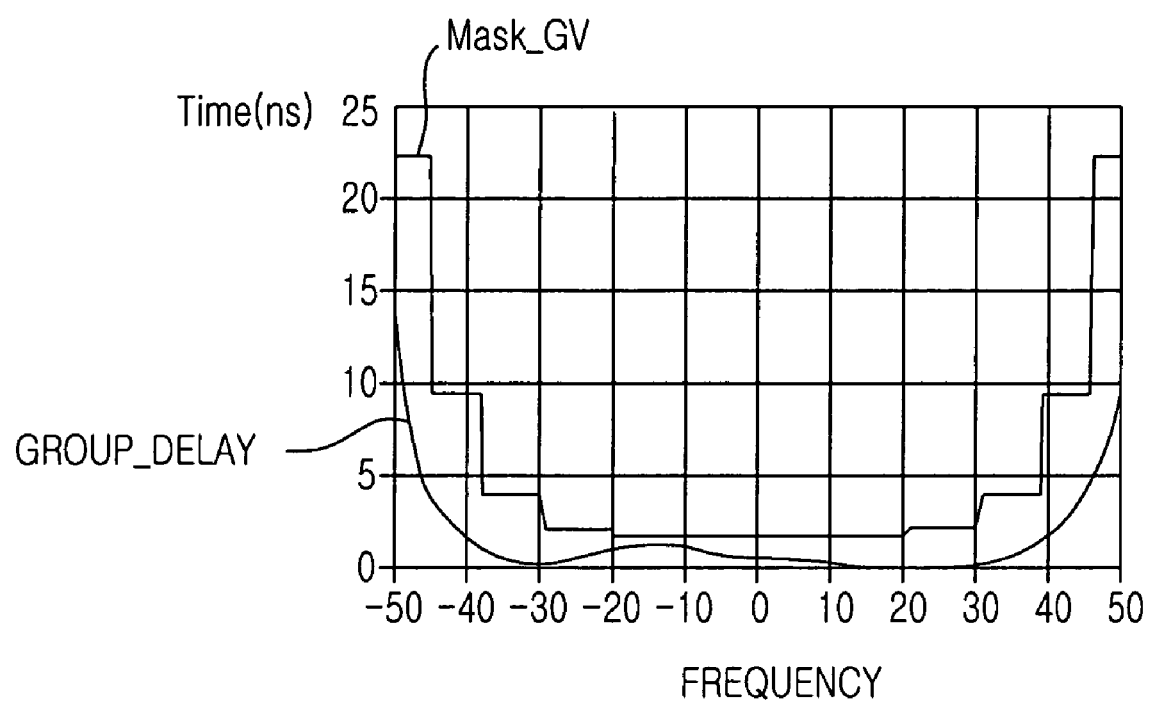
FIG. 3 is a graph showing a group_delay variation of an input multiplexer which is used as a reference information.

At step S200, a reference group_delay variation information (e.g., displayed video data), previously stored in the computer, of the EUT is loaded. Here, the reference group_delay variation information is a group_delay variation information of the EUT, which is has already veen tuned as seen in FIG. 3. That is, the group_delay variation information is given without the EMI from the horn antenna and the group_delay variation information without influence of EMI is used as reference information for determining the EMI level of the input multiplexer.

At step S201, the horn antenna is powered on for radiating electromagnetic wave and moves along a trace in the form of half-circle around the EUT with separating from the EUT by a predetermined distance.

At step S202, the vector network analyzer detects a scattering parameter of a generated signal outputted from the EUT at a plurality of detection positions A, B, C and D on the predetermined trace. The scattering parameter of the generated signal is varied in response to the electromagnetic wave radiated from the horn antenna and the group_delay variation information is generated based on the scattering parameter of the generated signal at each detection position.

At step S203, the computer receives the group_delay variation information of detection positions from the vector network analyzer and calculates an average value of variation between the group_delay variation information of all the required positions and the reference group_delay variation information. Based on the average value, a standard deviation value is calculated.

The average value and the standard deviation value are computed as follows.

The group_delay variation information is displayed at the monitor as a curve. If the curve is displayed at a two-dimensional plane such as a monitor with an x-axis and a y-axis, wherein the x-axis is divided into N, the y-axis is divided into M, M and N being positive integers, the brightness level of the (i,j)th dot along the curve is indicated as $B_{ij}^{REF}$ for the reference group-delay and $B_{ij}^{EMI}$ for the EMI-affected group-delay. By using the number values $B_{ij}^{REF}$ and $B_{ij}^{EMI}$ of the (i,j)th dot, an average and a standard deviation of the group_delay variation information and the reference group_delay variation information are computed.

The average value is computed by using following equation:

$$\mu = \frac{1}{NM} \sum_{i=1}^{N} \sum_{j=1}^{M} |B_{ij}^{EMI} - B_{ij}^{REF}|$$

Eq. 1

Wherein $\mu$ is an average value, N is positive integers representing the number of divisions of x-axis, M is positive integer representing the number of divisions of y-axis, $B_{ij}^{REF}$ represents the brightness level of the (i,j)th dot along the curve for the reference group-delay and $B_{ij}^{EMI}$ represents the brightness lever of the (i,j)th dot along the curve for the EMI-affected group-delay.

The standard deviation value is computed by following equation:

$$\sigma = \sqrt{\frac{1}{NM}\sum_{i=1}^{N}\sum_{j=1}^{M}\{|B_{ij}^{EMI} - B_{ij}^{REF}|-\mu\}^2} \qquad \text{Eq. 2}$$

Wherein σ is a standard deviation, μ is an average value, N is positive integers representing the number of divisions of x-axis, M is positive integer representing the number of divisions of y-axis, $B_{ij}^{REF}$ represents the brightness level of the (i,j)th dot along the curve for the reference group-delay and $B_{ij}^{EMI}$ represents the brightness lever of the (i,j)th dot along the curve for the EMI-affected group-delay.

For computing the average value and the standard deviation value, two schemes, i.e., a normal Gaussian distribution scheme and an arithmetic mean algorithm, can be used. The normal Gaussian distribution algorithm is used in a case that there are comparatively large number of dots used for displaying the group_delay variation information. The arithmetic average or a mean algorithm is used in a case that the numbers of dots representing the curves of group_delay variation information obtained at different detection positions are different.

Among the computed standard deviation values of detection positions, the largest one is selected and converted into an electrical power value at step S204. The largest standard deviation value is converted into the electrical power value by following equation.

$$\text{Level} = 10\log_{10}\left(\frac{\sigma_{max}^2}{4*50}\right) \qquad \text{Eq. 3}$$

Here, $\sigma_{max}$ is a maximum value of the standard deviation σ and Level represents an EMI level.

At step S205, the converted electrical power value is defined as an EMI level of the EUT.

FIG. 3 is a graph showing the group_delay variation of an EUT which is used as a reference group_delay variation information.

As shown in FIG. 3, the group_delay variation is detected after tuning the input multiplexer without EMI-influence.

Figure 4:
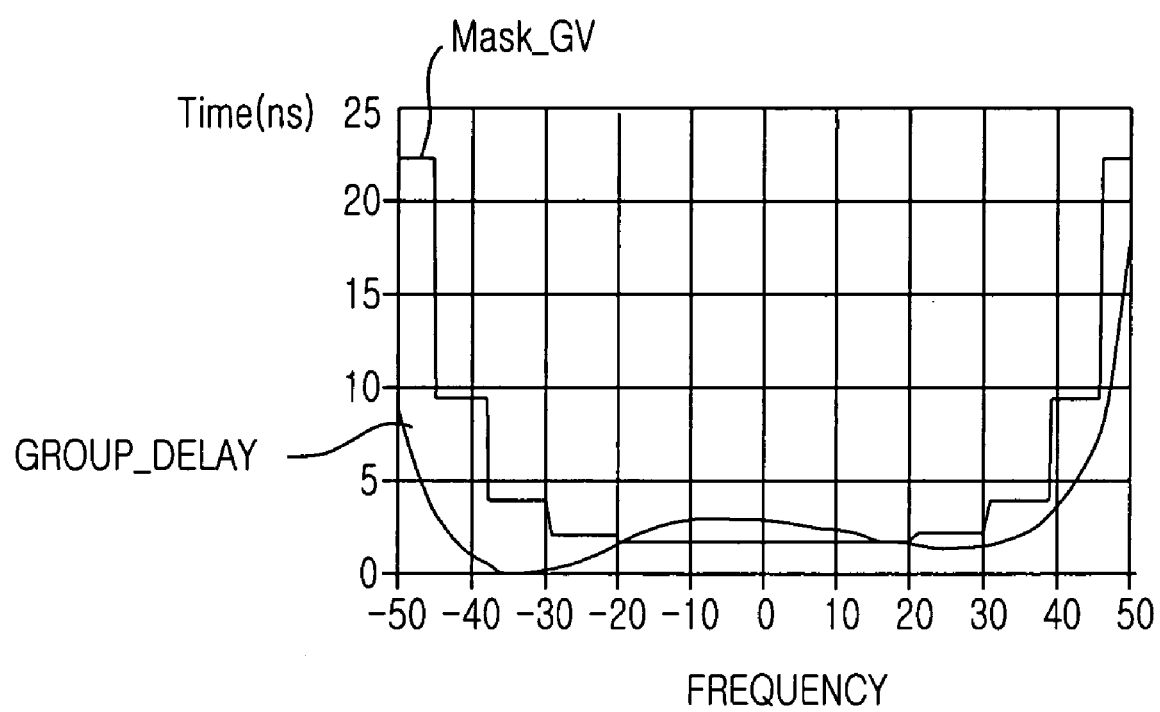
FIG. 4 is a graph showing the changes of the group_delay variation due to an EMI value.

FIG. 4 is a graph showing a change in the group_delay variation information due to the external EMI change.

As shown in FIG. 4, a certain frequency band of the group_delay variation information is changed by the electromagnetic wave radiated from the horn antenna.

As mentioned above, the method for measuring an EMI level of the EUT in accordance with the present invention detects the group_delay variation information by detecting a scattering parameters of a generated signal outputted from the EUT and determines an EMI level of the EUT based on the change between the group_delay variation information and the reference group_delay variation information.

The present invention can accurately measure the EMI level of electric device by analyzing the change of the group_delay variation information and the accurately measured EMI level can be used for predicting the performances of high frequency electric components and managing the qualities of high frequency electric devices.

The present application contains subject matter related to Korean patent application No. KR 2003-0093207, filed in the Korean patent office on Dec. 18, 2003, the entire contents of which being incorporated herein by reference.

While the present invention has been described with respect to certain preferred embodiments, it will be apparent to those skilled in the art that various changes and modifications may be made without departing from the scope and spirit of the invention as defined in the following claims.

What is claimed is:

1. An apparatus for measuring a level of electro magnetic interference (EMI) with an electronic device to radiate an electromagnetic wave, the apparatus comprising:
    a device for outputting a signal in response to the electromagnetic wave radiated from the electric device;
    means for calculating a group_delay variation information of the device by using the signal from the device;
    a processor for storing a reference group_delay variation; and
    an analyzer for analyzing the level of EMI by comparing the reference group_delay variation information with the group_delay variation information.

2. The apparatus as recited in claim 1, wherein the means for calculating is connected to the device.

3. The apparatus as recited in claim 1, further comprising means for absorbing the electromagnetic wave radiated from the electric device in order to protect the analyzer to be influenced from the electromagnetic wave.

4. The apparatus as recited in claim 1, wherein the analyzer computes an average and the standard deviation between the reference group_delay variation information and the group_delay variation information.

5. The apparatus as recited in claim 1, wherein the device is operated in high frequency.

6. A method for measuring a level of electric magnetic interference (EMI) with an electronic device to radiate an electromagnetic wave, the method comprising the steps of:
    a) loading a reference group_delay information of a device;
    b) at the electronic device, radiating the electromagnetic wave by moving along a predetermined trace;
    c) obtaining a group_delay variation information of the device which is varied according to the electromagnetic wave from the electronic device at a predetermined number of detection positions on the predetermined trace; and
    d) measuring an EMI level of the device by comparing the reference group_delay variation information and the group_delay variation information obtained.

7. The method as recited in claim 6, wherein the step d) includes the steps of:
    d1) calculating an average value of variation between the loaded reference group_delay variation information and the group_delay variation information of each detection position obtained from step c) and calculating standard deviation values of the predetermined number of detection positions based on the average value;
    d2) selecting a largest value among computed standard deviation values and converting the selected standard deviation value to an electrical power value; and
    d3) determining the electrical power value as an EMI level of the device.

* * * * *